United States Patent
Silberman et al.

(10) Patent No.: US 9,305,663 B2
(45) Date of Patent: Apr. 5, 2016

(54) TECHNIQUES FOR ASSESSING PASS/FAIL STATUS OF NON-VOLATILE MEMORY

(71) Applicant: NetApp, Inc., Sunnyvale, CA (US)

(72) Inventors: Joshua Silberman, Redwood City, CA (US); George Totolos, Cranberry Township, PA (US); Richard Strong, Pittsburgh, PA (US)

(73) Assignee: NetApp, Inc., Sunnyvale, CA (US)

( * ) Notice: Subject to any disclaimer, the term of this patent is extended or adjusted under 35 U.S.C. 154(b) by 55 days.

(21) Appl. No.: 14/135,663

(22) Filed: Dec. 20, 2013

(65) Prior Publication Data

US 2015/0178150 A1  Jun. 25, 2015

(51) Int. Cl.
| | |
|---|---|
| *G11C 29/42* | (2006.01) |
| *G11C 29/44* | (2006.01) |
| *G11C 29/04* | (2006.01) |
| *G06F 11/10* | (2006.01) |

(52) U.S. Cl.
CPC .......... *G11C 29/42* (2013.01); *G06F 11/1048* (2013.01); *G11C 29/44* (2013.01); *G11C 2029/0409* (2013.01); *G11C 2029/0411* (2013.01)

(58) Field of Classification Search
CPC .......... G06F 11/1068; G06F 11/1076; G06F 11/1044; G06F 11/1072; G06F 12/0246; G06F 11/076; G06F 29/42; G06F 11/1048; G06F 29/44; G06F 2029/0411; G06F 2029/0409
USPC .................... 714/763, 718, 723, 764
See application file for complete search history.

(56) References Cited

U.S. PATENT DOCUMENTS

| | | | | |
|---|---|---|---|---|
| 7,512,847 B2 * | 3/2009 | Bychkov et al. | .............. | 714/723 |
| 7,921,339 B2 * | 4/2011 | Chen et al. | ....................... | 714/54 |
| 8,078,923 B2 * | 12/2011 | Nagadomi et al. | ........... | 714/706 |
| 8,214,720 B2 * | 7/2012 | Tanaka et al. | ................. | 714/764 |
| 8,230,302 B2 * | 7/2012 | Hung et al. | .................... | 714/764 |
| 8,234,545 B2 * | 7/2012 | Shalvi et al. | ................... | 714/768 |
| 8,239,747 B2 * | 8/2012 | Cho et al. | ....................... | 714/805 |
| 8,250,417 B2 * | 8/2012 | Feeley et al. | .................. | 714/718 |
| 8,281,220 B2 * | 10/2012 | Kitahara | ....................... | 714/764 |
| 8,407,559 B2 * | 3/2013 | Yang et al. | .................... | 714/763 |
| 8,429,468 B2 * | 4/2013 | d'Abreu et al. | ............... | 714/706 |
| 8,429,497 B2 * | 4/2013 | Tu et al. | ......................... | 714/764 |
| 8,510,637 B2 * | 8/2013 | Tseng et al. | ................... | 714/773 |
| 8,560,919 B2 * | 10/2013 | D'Abreu et al. | .............. | 714/758 |
| 8,560,922 B2 * | 10/2013 | Bivens et al. | ................. | 714/763 |
| 8,601,347 B1 * | 12/2013 | Koseki | .......................... | 714/764 |
| 8,887,011 B2 * | 11/2014 | Luo et al. | ...................... | 714/721 |
| 8,972,775 B2 * | 3/2015 | Kim et al. | ..................... | 714/6.11 |
| 8,996,959 B2 * | 3/2015 | Jung et al. | ..................... | 714/773 |
| 2014/0075265 A1 * | 3/2014 | Hung et al. | .................... | 714/763 |

* cited by examiner

*Primary Examiner* — James C Kerveros
(74) *Attorney, Agent, or Firm* — LeClairRyan, a Professional Corporation (57) ABSTRACT

Examples are disclosed for assessing pass/fail status of non-volatile memory. In some examples, information may be received to indicate a block having memory pages associated with non-volatile memory cells. The information may indicate at least some of the memory pages have bit errors in excess of an error correction code (ECC) ability to correct. For these examples, the block may be selected for read testing. Read testing may include programming the memory pages with a known pattern and waiting a period of time. Following the period of time each memory page may be read and if a resulting pattern read matches the known pattern programmed to each memory page, the memory page passes. The block may be taken offline if the number of passing memory pages is below a pass threshold number. Other examples are described and claimed.

18 Claims, 6 Drawing Sheets

- RECEIVE INFORMATION FOR A BLOCK HAVING A PLURALITY OF MEMORY PAGES ASSOCIATED WITH A PLURALITY OF NVM CELLS, THE INFORMATION INDICATING THE PLURALITY OF MEMORY PAGES INCLUDES ONE OR MORE MEMORY PAGES WITH BIT ERRORS IN EXCESS OF AN ECC ABILITY TO CORRECT THE BIT ERRORS
  *502*

- SELECT THE BLOCK FOR READ TESTING
  *504*

- SCHEDULE THE BLOCK FOR PROGRAMMING OF A KNOWN PATTERN, THE BLOCK SCHEDULED SUCH THAT A FIXED TIME INTERVAL EXISTS BETWEEN PROGRAMMING OF THE BLOCK AND PROGRAMMING OF OTHER SELECTED BLOCKS WITH THE KNOWN PATTERN
  *506*

- PROGRAM EACH OF THE PLURALITY OF MEMORY PAGES WITH THE KNOWN PATTERN FOLLOWING AN ERASE PROCEDURE FOR THE BLOCK
  *508*

- READ, FOLLOWING A PERIOD OF TIME, A PATTERN FROM EACH MEMORY PAGE OF THE BLOCK
  *510*

- DETERMINE WHETHER EACH MEMORY PAGE PASSES THE READ TEST BASED ON THE PATTERN READ FROM EACH MEMORY PAGE MATCHING THE KNOWN PATTERN PROGRAMMED TO EACH MEMORY PAGE
  *512*

- TAKE THE BLOCK OFFLINE IF A NUMBER OF PASSING MEMORY PAGES IS BELOW A PASS THRESHOLD NUMBER
  *514*

TECHNIQUES FOR ASSESSING PASS/FAIL STATUS OF NON-VOLATILE MEMORY

BACKGROUND

Types of non-volatile memory such as flash memory may be organized according to blocks, which are typically erased prior to storing data in the blocks. Repeated erasures may eventually wear out types of non-volatile memory such as flash and may reduce an ability to retain data. An ability to retain data after repeated erasures is often referred to as "endurance". Endurance may refer to a number of times a block of non-volatile memory may be erased and still operate reliably.

Endurance for various types of non-volatile memory such as NAND flash memory may be finite. As a result of having a finite endurance, data storage products that utilize types of non-volatile memory such as NAND flash memory may require a pass/fail test to repeatedly assess data retention capabilities of a given block. Repeated assessment of data retention capabilities may be needed if the given block has a propensity to go "bad" over a data storage operational life. An eventual failure of repeated pass/fail tests may result in removing the given block from a pool of available blocks.

DETAILED DESCRIPTION

As contemplated in the present disclosure, types of non-volatile memory such as NAND flash memory may require a pass/fail test to repeatedly assess data retention capabilities or endurance. In some examples, storing data in a type of single-level cell (SLC) NAND flash memory may be a two-step operation: (1) first an entire given block is erased, which sets all bits in each cell of the block to '1', and the (2) subsets of the given block—memory pages—are programmed by setting desired bits in given cells to '0'. Typically, SLC NAND flash devices may have built-in status checks for these two operations, erase and program, and some storage products utilizing these SLC NAND flash devices may use either a program or erase failure as an indication that the given block should be marked as "bad" and taken offline or no longer used.

The approach mentioned above for SLC NAND flash devices or other types of SLC non-volatile memory devices may not be valid for all types of NAND flash devices. For example, erase and program status checks built into NAND flash devices may make assumptions about how many bit errors can be tolerated before being taken offline. However, these assumptions may differ significantly from error correction code (ECC) strengths used by some storage products utilizing NAND flash or other types of non-volatile memory. Furthermore, types of multi-level non-volatile memory cells such as enterprise multi-level cell (MLC) (eMLC) NAND flash memory may be more susceptible or less tolerant to disturb effects compared to SLC NAND flash memory. The disturb effects may be due to parasitic electric fields generated by reading or writing data in neighboring multi-level flash memory cells that may cause bit corruption in a given multi-level flash memory cell.

Disturb effects may have a potential to corrupt all blocks, not just those nearing an endurance limit. This may be problematic to storage devices that should be able to distinguish between worn-out blocks (reached endurance limits) and otherwise healthy blocks that may have been subjected to disturbances. An inability to distinguish between worn-out and disturbance failures may result in otherwise healthy blocks being taken offline when they could possibly be reused. Storage devices used in cache applications, where data is refreshed periodically and does not require long term data integrity guarantees, may benefit from differentiating between failures due to endurance limits and failures due to disturbances. That differentiation may lead to maintaining a greater amount of storage capacity for a longer period of time compared to prematurely taking some blocks offline. It is with respect to these and other challenges that the examples described herein are needed.

According to some examples, techniques for assessing pass/fail status of non-volatile memory may be implemented. These techniques may include receiving information for a block having a plurality of memory pages associated with a plurality of non-volatile memory cells. The information may indicate that the plurality of memory pages includes one or more memory pages with bit errors in excess of an error correction code (ECC) ability to correct the bit errors. The techniques may also include selecting the block for read testing, programming each of the plurality of memory pages with a known pattern following an erase procedure for the block and reading, following a period of time, a pattern from each memory page of the block. The techniques may also include determining whether each memory page passes the read test based on the pattern read from each memory page matching the known pattern programmed to each memory page. The read test may be constructed such that pass/fail determination is made based on a number of errors found in the read data and how close this number is to a threshold of achievable error correction. In some examples, if a number of passing memory pages is below the threshold, the block may be taken offline.

Figure 1:
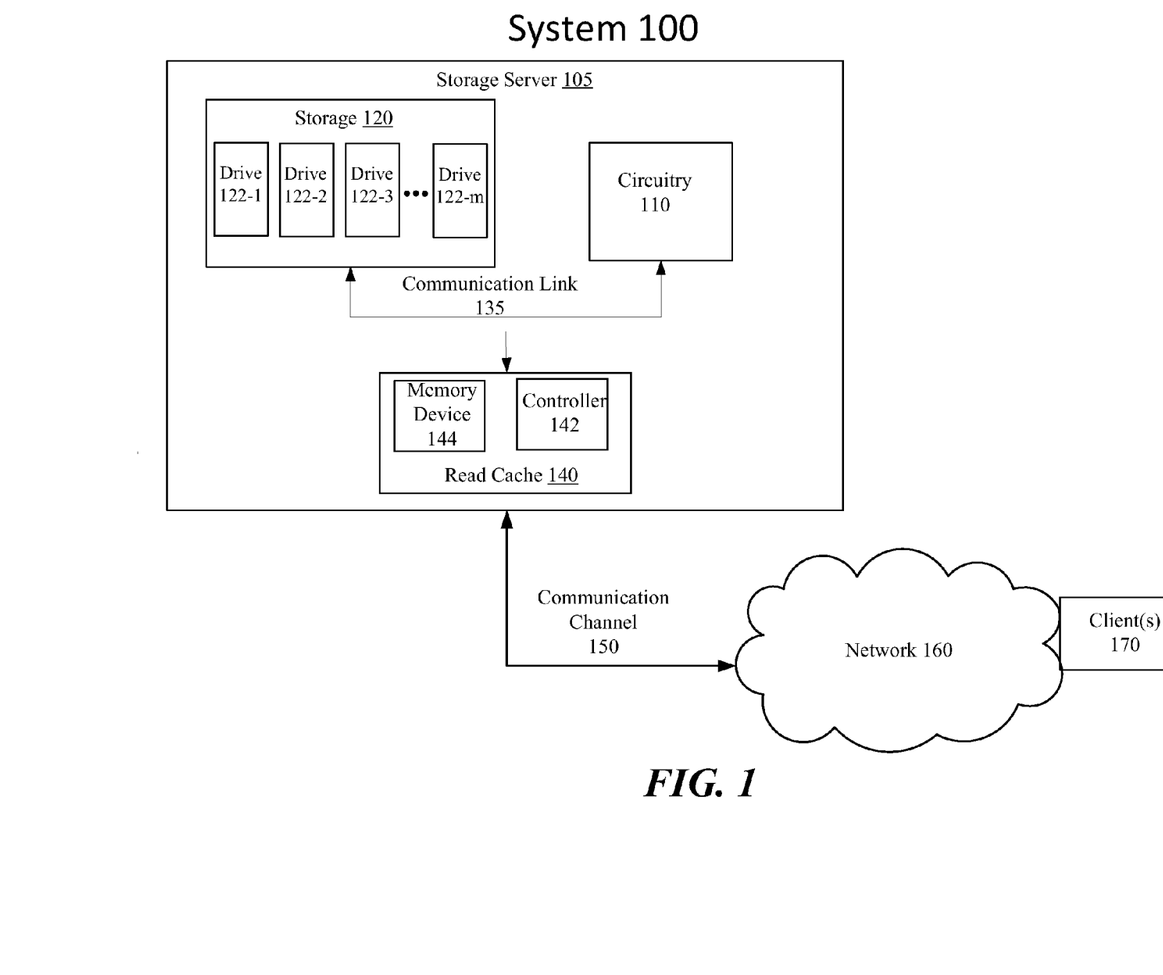
FIG. 1 illustrates an example system.

FIG. 1 illustrates an example system 100. As shown in FIG. 1, system 100 includes a storage server 105 having a circuitry 110, storage 120 and a read cache 140. Also as shown in FIG. 1, communication channel 150 coupled between storage server 105 and a network 160 may enable client(s) 170 to possibly storage server 105 through network 160.

In some examples, as shown in FIG. 1, storage server 105 may include circuitry 110. For these examples, circuitry 110 may include logic and/or features to control or manage access to storage 120 or read cache 140 and may include, singly or in any combination, analog circuitry, digital circuitry, hardwired circuitry, programmable circuitry, co-processor circuitry, state machine circuitry, and/or memory that may include program instruction that may be executed by programmable circuitry. Also, in some examples, circuitry 110 may include a host processor or central processing unit (CPU) having one or more processor cores or include a multi-socket processor package.

According to some examples, as shown in FIG. 1, storage 120 may include drives 122-1, 122-2, 122-3 to 122-m, where "m" may be any positive whole integer greater than 3. For these examples, drives 122-1 to 122-m may include various types of storage drives to include rotating hard disk drives and/or solid-state drives.

In some examples, as shown in FIG. 1, read cache 140 may include a controller 142 and a memory device 144. For these examples, controller 142 may include logic and/or features to manage or control memory device 144. As described more below, memory device 144 may include one or more types of non-volatile memory (NVM) arrays having NVM cells. These NVM arrays may at least temporarily store cache information obtained or read from drives maintained at storage 120 via communication link 135. This cache information may facilitate a faster access of at least some information or data commonly requested by client(s) 170 through network 160 and via communication channel 150. According to some examples, communication link 135 may include, but is not limited to, a serial interconnect such as a peripheral component interconnect express (PCIe) interconnect. For these examples, read cache 140 may couple to circuitry 110 and storage 120 via the PCIe interconnect to facilitate read access to drives 122-1 to 122-m by client(s) 170 coupled to storage server 105 via communication channel 150 routed through network 160.

According to examples, communication channel 150 may include wired or wireless communication mediums that may couple to network 160 according to various wired or wireless communication protocols that may include storage access protocols. For these examples, network 160 may include a wire/wireless wide access network such a WAN or WLAN or a wired/wireless local access network such as a WLAN or LAN.

Figure 2:
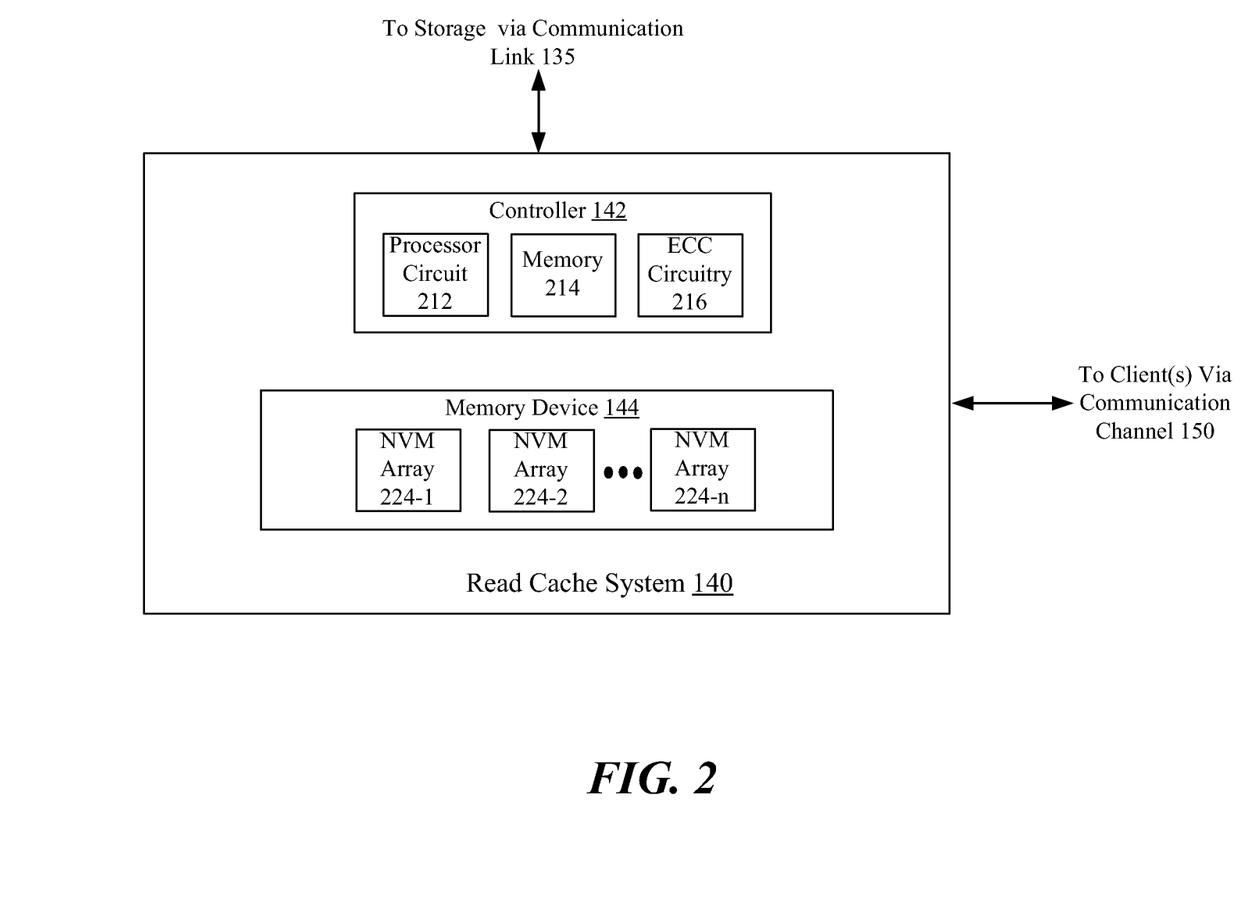
FIG. 2 illustrates an example read cache device.

FIG. 2 illustrates an example read cache device. As shown in FIG. 2, the example read cache device may include read cache 140 that has controller 142 and memory device 144. In some examples, as shown in FIG. 2, controller 142 may include a processor circuit 212, a memory 214 or ECC circuitry 216. Also as shown in FIG. 2, memory device 144 may include NVM arrays 224-1, 224-2 or 224-n, where "n" is any positive whole integer greater than 2.

In some examples, processor circuit 212, memory 214 or ECC circuitry 216 may support logic and/or features to control or manage memory devices 144. Control or management of memory device 144 may include logic and/or features of controller 142 receiving information from ECC circuitry 216 for a block at memory device 144 having a plurality of memory pages associated with a plurality of NVM cells. The plurality of NVM cells may be included in one or more of NVM arrays 224-1 to 224-n. The information may indicate that the plurality of memory pages includes one or more memory pages with bit errors in excess of an ECC ability to correct the bit errors. In other words, ECC circuitry 216 may not be able to correct all bit errors detected in the block and may indicate to logic and/or features of controller 142 this lack of ability to correct the bit errors for at least some of the memory pages. The information may also include more details such as a number of bit errors detected in the block that may be an exact number or a range of numbers. As described more below, the logic and/or features of controller 142 may decide whether to perform read testing on the block and may further decide whether to take the block offline based on results of the read testing.

According to some examples, using a read test to determine whether to take the block offline may enable at least some of the memory blocks that experienced excessive bit errors due to possible disturb effects to be kept on-line. This may be beneficial for read cache devices such as read cache 140 as more available memory capacity will improve the cache's hit rate and ability to optimize client access to data pulled from one or more drives maintained at a storage server.

In some examples, NVM arrays 224-1 to 224-n may include various types of non-volatile memory having NVM cells to include but not limited to phase change memory (PCM), flash memory (e.g., NAND), ferroelectric memory, silicon-oxide-nitride-oxide-silicon (SONOS) memory, polymer memory such as ferroelectric polymer memory, nanowire, ferroelectric transistor random access memory (FeTRAM or FeRAM) or electrically erasable programmable read-only memory (EEPROM).

Figure 3:
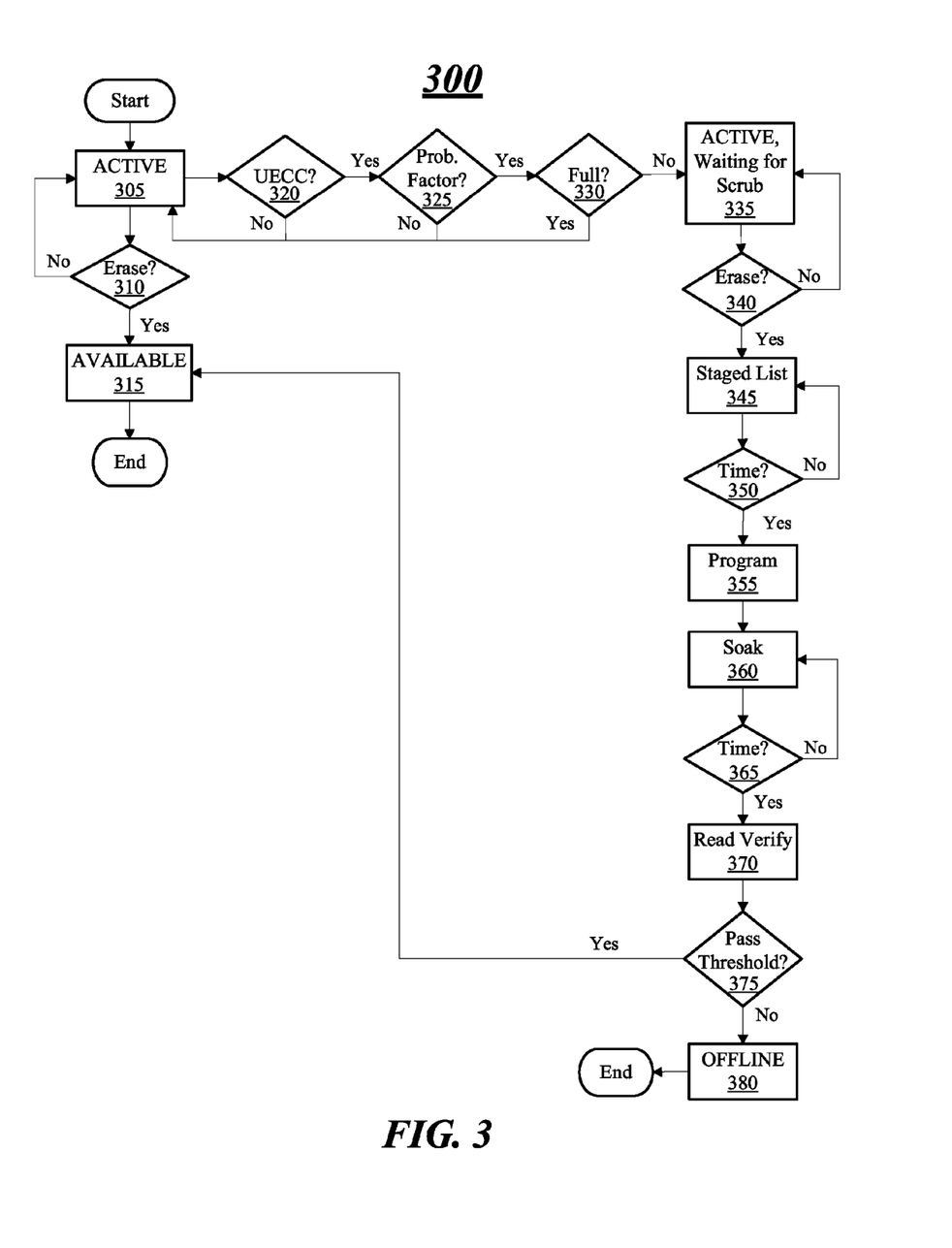
FIG. 3 illustrates an example process.

FIG. 3 illustrates example process 300. In some examples, process 300 may be for assessing a pass/fail status of non-volatile memory. For these examples, elements of system 100 as shown in FIG. 1 or read cache 140 in FIG. 2 may be used to illustrate example operations related to process 300. However, the example processes or operations are not limited to implementations using elements of system 100 or read cache 140.

According to some examples, various terms and their associated definitions may serve to describe elements of process 300 to assess a pass/fail status of NVM. For example, an NVM array may include a plurality NVM cells. A block may be a portion of an NVM array such as NVM array 224-1. A memory page may be a sub portion of a block. An erase operation may include an operation that sets all bits to '1' for NVM cells included in a given memory page. A read operation may include a "read" that is performed per memory page. An uncorrectable ECC (UECC) may be trigged by a memory page having bit errors in excess of an ECC circuitry's correction ability (e.g., ECC circuitry 216 ability to correct).

In some examples, a plane may be a grouping of blocks. Operations on blocks in different planes may be run in parallel to reduce latencies. For these examples, some memory array architectures such as for NAND flash memory may group flash blocks into large units called planes. Operations on flash blocks in different planes may be run in parallel to improve execution times for at some NAND operations.

According to some examples, AVAILABLE may indicate that a block does not currently hold cache data but is erased and ready to be used for caching. Meanwhile, ACTIVE may indicate that a block holds valid cache data. Also, ACTIVE, Waiting for Read Test/Scrub may indicate that a block holds valid cache data and is still being actively used, but has been selected for a read test/scrub.

In some examples, as described more below, read test/scrub is a process of program, soak and read verify to assess data retention properties of a block. For these examples, the block may go through one or more selection steps before actually being read tested/scrubbed. Also, OFFLINE may indicate a block failing a read test/scrub that may be permanently removed from use at a cache.

Beginning process 300 may include moving from Start to block 305 (ACTIVE), logic and/or features at controller 142 may determine that a block having a plurality of memory pages associated with a plurality of NVM memory cells from among NVM arrays 224-1 to 224-n may hold valid cache data. For these examples, the valid cache data may have been received from one or more drives 122-1 to 122-m maintained by storage 120 at storage server 105.

Proceeding from block 305 to decision block 310 (Erase), logic and/or features at controller 142 may determine whether an "Erase" command has been received to set all bits to '1' for the block determined to be ACTIVE. The "Erase" command, for example, may be received from upper software supported by circuitry 110 at storage server 105. For these examples, if no "Erase" command has been received the process moves to block 305. Otherwise, the process moves to block 315.

Moving from decision block 310 to block 315 (AVAILABLE), assuming no indication of one or more memory pages having bit errors in excess of an ECC ability to correct (UECC), the block may be marked as AVAILABLE and thus ready to cache data. The process may then come to an end for this erased and AVAILABLE block.

Proceeding from block 305 to decision block 320 (UECC?), logic and/or features at controller 142 may determine whether information had been received to indicate if the ACTIVE block includes one or more memory pages with UECC bit errors. In some examples, the indication may have been received from ECC circuitry 216 of controller 142 following the programing of the ACTIVE block and ECC circuitry 216's unsuccessful attempt to correct detected bit errors in the one or more memory pages. If no indication of UECC bit errors has been received, the process moves to block 305. Otherwise the process moves to decision block 325.

Moving from decision block 320 to decision block 325 (Prob. Factor?), logic and/or features at controller 142 may have a pre-established probability factor to select a fraction or percentage of ACTIVE blocks identified as having UECC bit errors. In some examples, the probability factor may be set at a percentage that balances testing of blocks with using computing resources of controller 142 to read test ACTIVE blocks identified as having UECC bit errors. For example, the probability factor may be at 0.9 or 90% for not read testing or 0.1 or 10% for testing ACTIVE blocks identified as having UECC bit errors. These probability factors may be adjusted depending on operating characteristics that allow for more computing resources to be used or reduce available computing resources. If the ACTIVE block's probability factor results in that block being selected (e.g., $10^{th}$ block identified with a probability factor of 0.1) the process moves to decision block 330. Otherwise, the process moves to block 305.

Moving from decision block 325 to decision block 330 (Full?), logic and/or features at controller 142 may determine whether a total number of blocks currently selected for read testing exceeds a test threshold number of blocks for read testing. In some examples, the test threshold number may prevent a situation where too many blocks of memory device 144 are tied up for read testing. For these examples, the test threshold may be derived or based on a total number of blocks included in a given NVM array as well as a number of planes for a plane configuration associated with the given NVM array. If the test threshold has been met or exceeded, the block is not selected and the process moves to block 305. Otherwise, the block is selected for read testing and the process moves to block 335.

In some examples, a 2-plane configuration may include a set of two blocks and a 4-plane configuration may include a set of four blocks. Because some "Erase" or "Program" operations on the given NVM array may be grouped based on plane configurations, if one block of a 2-plane configuration is selected then both blocks in the pair become unavailable even only one block is being read tested. Similarly, if one block of a 4-plane configuration is selected than all four blocks become unavailable. The test threshold may be set such that no more than 50% of AVAILABLE blocks are selected for testing at the same time. So for the 2-plane configuration, the test threshold may be set such that no more than 25% of AVAILABLE blocks may be selected and for the 4-plane configuration, no more than 12.5% of AVAILABLE blocks may be selected.

Moving from decision block 330 to block 335 (ACTIVE, Waiting for Scrub), the ACTIVE block selected for read testing or scrub may wait for an "Erase" operation. In some examples, the ACTIVE block still contains valid cache data and the wait is to accommodate the maintaining of the valid cache data.

Proceeding from block 335 to decision block 340 (Erase?), logic and/or features at controller 142 may determine whether an "Erase" operation has been received that may indicate valid cache data may no longer be needed at the block and that lack of need triggered the "Erase" operation. If an "Erase" operation has been conducted on the block, the process moves to block 345. Otherwise the process moves to block 335.

Moving from decision block 340 to block 345 (Staged List), logic and/or features at controller 142 may add the block to a staged list following the "Erase" operation. In some examples, the staged list may include those blocks that have been erased and are now scheduled to be read tested/scrubbed. For these examples, the schedule may be based on a fixed time interval. The fixed time interval may be based on balancing computing resources at controller 142 that may be needed to program scheduled blocks for read testing with the number of blocks scheduled that may grow the longer the fixed time interval. For example, the fixed time may be set at 10 minutes to strike an acceptable balance that may keep the number of scheduled blocks to an acceptable level yet not consume excessive amounts of computing resources. The fixed time interval may be occasionally adjusted if more or less computing resources become available or if the number of schedule blocks becomes too high/low for a given fixed time interval.

Proceeding from block 345 to decision block 350 (Time?), logic and/or features at controller 142 may determine whether the fixed time for the scheduled block has elapsed. If the fixed time has elapsed the process moves to block 355. Otherwise, the process moves to block 345.

Moving from decision block 350 to block 355 (Program), logic and/or features at controller 142 may program each of the plurality of memory pages included in the block with a known pattern. In some examples, the logic and/or features at controller 142 may be capable of causing a "Program" operation that includes using normal memory page write mechanisms to program the known pattern.

Proceeding from block 355 to block 360 (Soak), logic and/or features at controller 142 may wait a period of time after the "Program" operation. According to some examples, the period of time may allow for a differentiation between errors possibly caused by disturb effects that may be short-lived compared to errors caused by endurance-like issues with NVM memory cells for programmed memory pages that may not be short-lived. For these examples, the period of time may be 24 hours, however, soak times of more or less than 24 hours may be used in other examples.

Proceeding from block 360 to decision block 365 (Time?), logic and/or features at controller 142 may determine whether the period of time for soaking has elapsed. As mentioned above the period of time may be 24 hours. If the period of time has elapsed, the process moves to block 370. Otherwise, the process moves to block 360.

Moving from decision block 365 to block 370 (Read Verify), logic and/or features at controller 142 may read a pattern from each memory page of the block and verify whether each memory page passes the read test based on the pattern read from each memory page matching the known pattern programmed to each memory page.

Proceeding from block 370 to decision block 375 (Pass Threshold?), logic and/or features at controller 142 may determine whether a number of passing memory pages is above or below a pass threshold. In some examples, the pass threshold may be set at 87.5% so that at least 87.5% of the memory pages need to pass the read test to keep the block on-line or among a pool of AVAILABLE blocks. The pass threshold percentage may be higher or lower to account for a need for possible more AVAILABLE blocks (lower pass threshold) in relation to a need for more reliable AVAILABLE blocks (higher pass threshold). If the pass threshold is met or exceeded, the process moves to block 315. Otherwise the process moves to block 380.

Moving from decision block 375 to block 380 (OFFLINE), logic and/or features at controller 142 may deem the block as failing the read test and identify the block as OFFLINE. In some examples, blocks identified as OFFLINE are removed from future use to cache data. The process may then come to an end.

Figure 4:
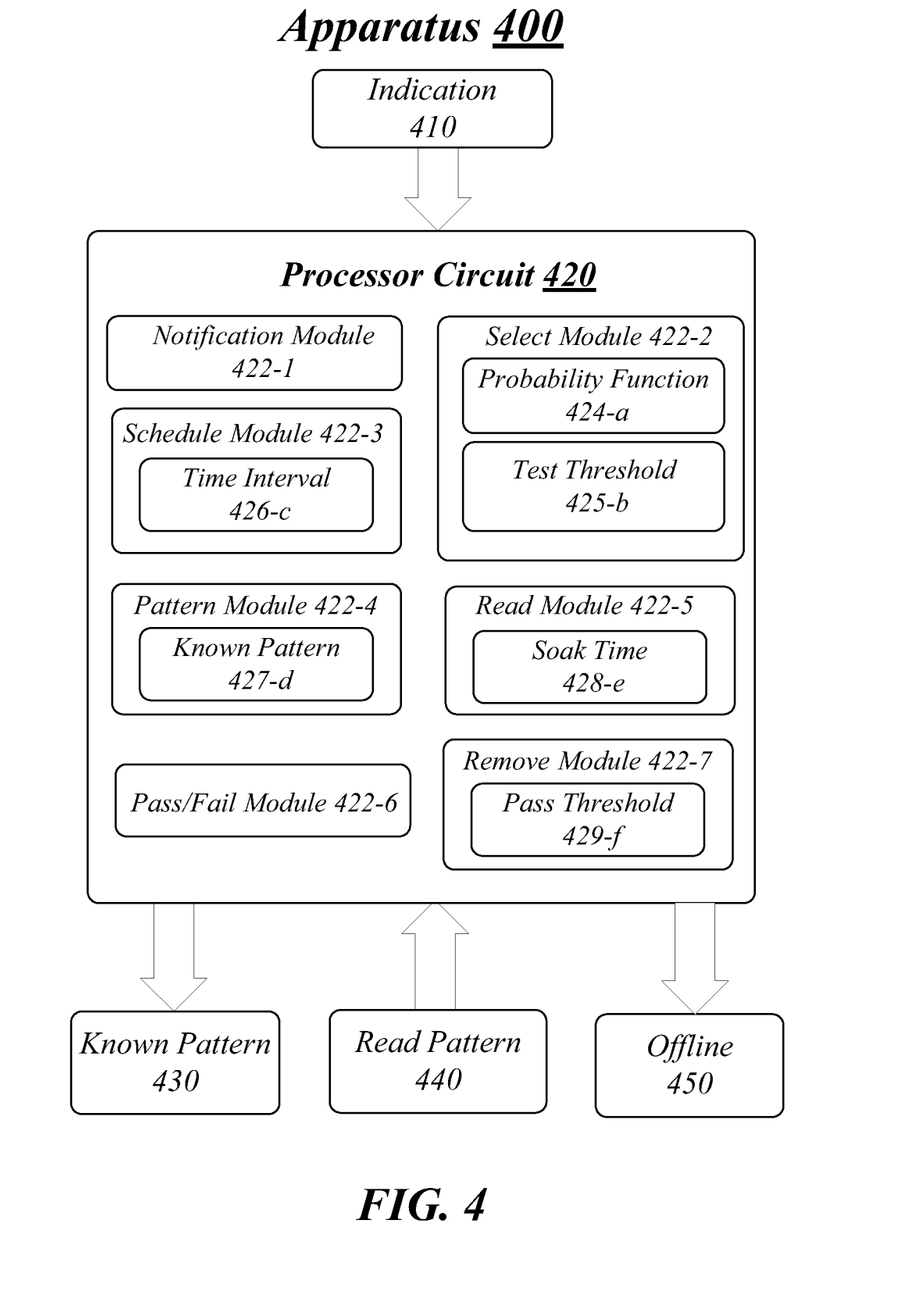
FIG. 4 illustrates an example apparatus.

FIG. 4 illustrates an example apparatus 400. Although the apparatus 400 shown in FIG. 4 has a limited number of elements in a certain topology, it may be appreciated that the apparatus 400 may include more or less elements in alternate topologies as desired for a given implementation.

The apparatus 400 may comprise a computer-implemented apparatus that may encompass at least some of the capabilities mentioned above for the logic and/or features located at controller 142 of read cache 140 as described for FIGS. 1-3. The computer-implemented apparatus 400 may be arranged to execute one or more software and/or firmware modules 422-a. It is worthy to note that "a" and "b" and "c" and similar designators as used herein are intended to be variables representing any positive integer. Thus, for example, if an implementation sets a value for a=7, then a complete set of software modules 422-a may include modules 422-1, 422-2, 422-3, 422-4, 422-5, 422-6 or 422-7. The examples are not limited in this context.

In some examples, as shown in FIG. 4, apparatus 400 includes processor circuit 420. Processor circuit 420 may be generally arranged to execute one or more modules 422-a. Processor circuit 420 can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Qualcomm® Snapdragon®; Intel® Celeron®, Core (2) Duo®, Core i3, Core i5, Core i7, Itanium®, Pentium®, Xeon®, Atom® and XScale® processors; and similar processors. Dual microprocessors, multi-core processors, and other multi-processor architectures may also be employed as processor circuit 420. According to some examples processor circuit 420 may also include an application specific integrated circuit (ASIC) and modules 422-a may be implemented as firmware by hardware elements of the ASIC.

According to some examples, apparatus 400 may include a notification module 422-1. Notification module 422-1 may be executed by processor circuit 420 to receive information for a block having a plurality of memory pages associated with a plurality of NVM cells. The information may be received via indication 410 which may include an indication that the plurality of memory pages includes one or more memory pages with UECC bit errors.

In some examples, apparatus 400 may also include a select module 422-2. Select module 422-2 may be executed by processor circuit 420 to select the block for read testing. In some examples, select module 422-2 may maintain probability function 424-a in a data structure such as a lookup table (LUT) that may be used to select the block for read testing. Probability function 424-a may include a probability factor that causes a given percentage of blocks to be selected from among a plurality of blocks that may have been identified as having UECC bit errors. According to some examples, select module 422-5 may also maintain test threshold 425-b (e.g., in a LUT). Test threshold 425-b may cause select module 422-5 to select the block for read testing if a total number of blocks currently selected for read testing has not exceeded a test threshold number maintained in test threshold 425-b.

In some examples, apparatus 400 may also include a schedule module 422-3. Schedule module 422-3 may be executed by processor circuit 420 to schedule the block for read testing. For these examples, the block may be scheduled based on a fixed time interval. Schedule module 422-3 may maintain time interval 426-c (e.g., in a LUT). Time interval 426-c may include the fixed time interval used by schedule module 422-3 to schedule the block for read testing.

According to some examples, apparatus 400 may also include a pattern module 422-4. Pattern module 422-4 may be executed by processor circuit 420 to program each of the plurality of memory pages with a known pattern following an "Erase" operation or procedure for the block. For these examples, pattern module 422-4 may maintained known pattern 427-d (e.g., in a LUT). Known pattern 427-d may include one or more known patterns used to program the block for the read test. In some examples, known pattern 430 may include the known pattern that may be programmed to the block via a "Program" operation.

In some examples, apparatus 400 may also include a read module 422-5. Read module 422-5 may be executed by processor circuit 420 to read, following a period of time, a pattern from each memory page of the block. For these examples, read module 422-5 may maintain soak time 428-a that may include the time period for which the block is soaked before the read pattern is obtained. According to some examples, read pattern 440 may include the pattern read by read module 422-5.

According to some examples, apparatus 400 may also include a pass/fail module 422-6. Pass/fail module 422-6 may determine whether each memory page passes the read test based on read pattern 440 matching known pattern 430. If a match occurs for a given memory page, the given memory page may be deemed as passing. If no match occurs, the given memory page may be deemed as failing.

In some examples, apparatus 400 may also include a remove module 422-7. Remove module 422-7 may be executed by processor circuit 420 to cause the block to be taken offline if a number of passing memory pages determined by pass/fail module 422-6 is below a pass threshold number. For these examples, remove module 422-7 may maintain pass threshold 429-f (e.g., in a LUT) that include the pass threshold number. Offline 450 may be sent to a memory device that maintains the block to indicate that the block is now deemed to be OFFLINE and may be removed from use.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

Figure 5:
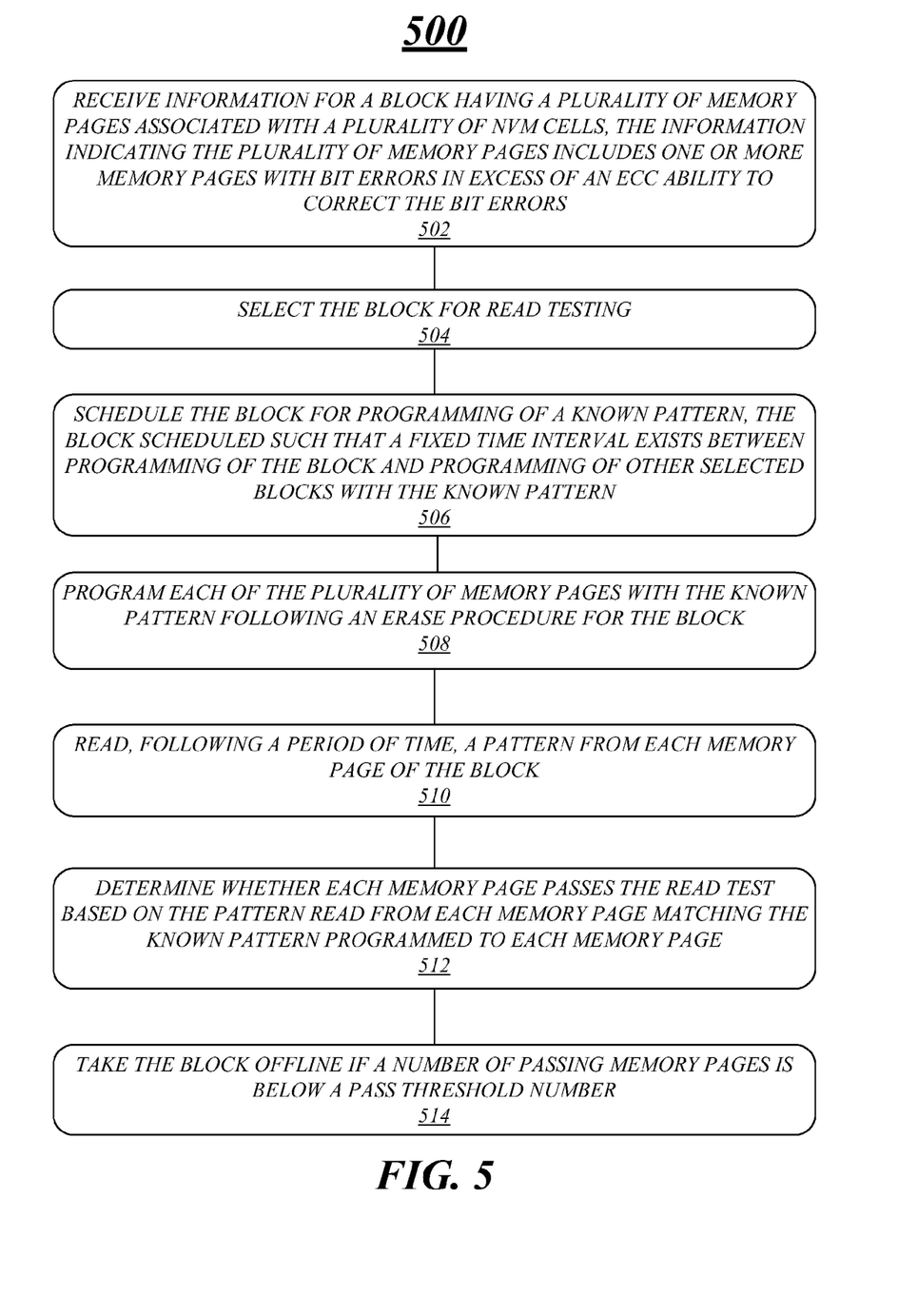
FIG. 5 illustrates an example logic flow.

FIG. 5 illustrates a logic flow 500. Logic flow 500 may be representative of some or all of the operations executed by one or more logic, features, or devices described herein, such as apparatus 400. More particularly, logic flow 500 may be implemented by notification module 422-1, select module 422-2, schedule module 422-3, pattern module 422-4, read module 422-5, pass/fail module 422-6 or remove module 422-7.

In some examples, logic flow 500 at block 502 may receive information for a block having a plurality of memory pages associated with a plurality of NVM cells, the information indicating the plurality of memory pages includes one or more memory pages with bit errors in excess of an ECC ability to correct the bit errors. For these examples, notification module 422-1 may receive the information.

According to some examples, logic flow 500 at block 504 may select the block for read testing. For these examples, select module 422-2 may select the block for read testing.

According to some examples, logic flow 500 at block 506 may schedule the block for programming of a known pattern, the block scheduled such that a fixed time interval exists between programming of the block and programming of other selected blocks with the known pattern. For these examples, schedule module 422-3 may schedule the block for programming using the fixed time interval.

In some examples, logic flow 500 at block 508 may program each of the plurality of memory pages with the known pattern following an erase procedure for the block. For these examples, pattern module 422-4 may program each of the plurality of memory pages with the known pattern.

According to some examples, logic flow 500 at block 510 may read, following a period of time (soak time), a pattern from each memory page of the block. For these examples, read module 422-5 may read the pattern from each memory page following the period of time.

In some examples, logic flow 500 at block 512 may determine whether each memory page passes the read test based on the pattern read from each memory page matching the known pattern programmed to each memory page. For these examples, pass/fail module may make the determination as to whether each memory page passes the read test.

In some examples, logic flow 500 at block 514 may take the block offline if the number of passing memory pages is below a pass threshold number. For these examples, remove module 422-7 may cause the block to be taken offline if the number of passing memory pages is below the pass threshold number by indicating (e.g., to a memory device) that the block is OFFLINE and hence to no longer be used for caching data.

Figure 6:
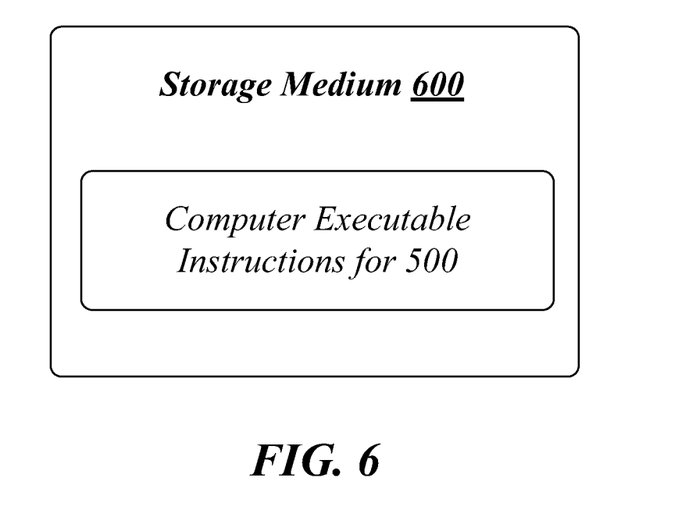
FIG. 6 illustrates an example storage medium.

FIG. 6 illustrates an embodiment of a storage medium 600. The storage medium 600 may comprise an article of manufacture. In some examples, storage medium 600 may include any non-transitory computer readable medium or machine readable medium, such as an optical, magnetic or semiconductor storage. Storage medium 600 may store various types of computer executable instructions, such as instructions to implement logic flow 500. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 7:
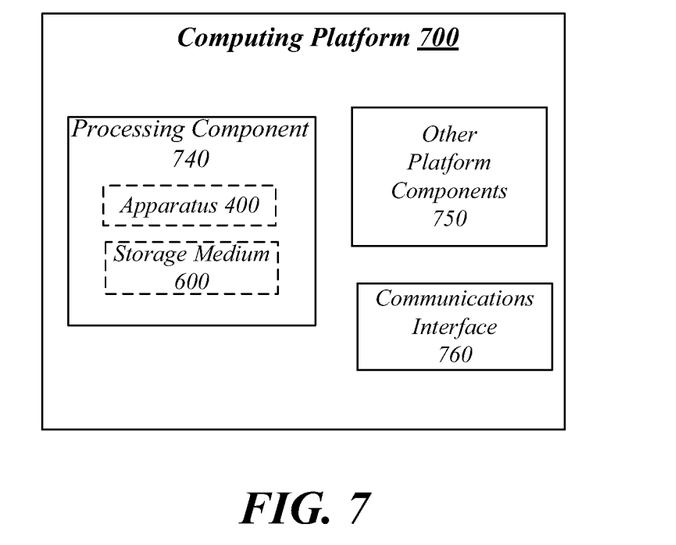
FIG. 7 illustrates an example computing platform.

FIG. 7 illustrates an example computing device 700. In some examples, as shown in FIG. 7, computing device 700 may include a processing component 740, other platform components 750 or a communications interface 760.

According to some examples, processing component 740 may execute processing operations or logic for apparatus 400 and/or storage medium 600. Processing component 740 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 750 may include common computing elements, such as one or more processors, multi-core processors, co-processors, memory units, chipsets, controllers, peripherals, interfaces, oscillators, timing devices, video cards, audio cards, multimedia input/output (I/O) components (e.g., digital displays), power supplies, and so forth. Examples of memory units associated with either other platform components 750 may include without limitation, various types of computer readable and machine readable storage media in the form of one or more higher speed memory units, such as ROM, RAM, DRAM, Double-Data-Rate DRAM (DDRAM), synchronous DRAM (SDRAM), SRAM, programmable ROM (PROM), EPROM, EEPROM, NAND flash memory, NOR flash memory, polymer memory such as ferroelectric polymer memory, ferroelectric transistor random access memory (FeTRAM or FeRAM), nanowire, ovonic memory, ferroelectric memory, 3-dimentional cross-point memory, SONOS memory, magnetic or optical cards, an array of devices such as Redundant Array of Independent Disks (RAID) drives, solid state memory devices (e.g., USB memory), SSDs and any other type of storage media suitable for storing information.

In some examples, communications interface 760 may include logic and/or features to support a communication interface. For these examples, communications interface 760 may include one or more communication interfaces that operate according to various communication protocols or standards to communicate over direct or network communication links. Direct communications may occur via use of communication protocols or standards described in one or more industry standards (including progenies and variants) to include the Peripheral Component Interconnect (PCI) Express Base Specification, revision 3.0, published in November 2010 ("PCI Express" or "PCIe"), the Universal Serial Bus Specification, revision 3.0, published in November 2008 ("USB"), the Serial ATA (SATA) Specification, revision 3.1, published in July 2001, Request for Comments (RFC) 3720, Internet Small Computer System Interface (iSCSI), published in April 2004 and/or the Serial Attached SCSI (SAS) Specification, revision 2.1, published in December 2010. Network communications may occur via use of various communication protocols and may operate in compliance with one or more promulgated standards or specifications for wired or wireless networks by the Institute of Electrical Engineers (IEEE). These standards are specifications may include, but are not limited to, IEEE 802.11-2012 Standard for Information technology—Telecommunications and information exchange between systems—Local and metropolitan area networks—Specific requirements Part 11: WLAN Media Access Controller (MAC) and Physical Layer (PHY) Specifications, published March 2012, later versions of this standard ("IEEE 802.11") for wireless mediums or IEEE 802.3-2008, Carrier sense Multiple access with Collision Detection (CSMA/CD) Access Method and Physical Layer Specifications, Published in December 2008 (hereinafter "IEEE 802.3") for wired mediums, one or more protocols that may encapsulate Fibre Channel frames over Ethernet networks referred to as fiber channel over Ethernet (FCoE), compatible with the protocols described by the American National Standard of Accredited Standards Committee INCITS T11 Technical Committee, Fibre Channel Backbone-5 (FC-BB-5) Standard, Revision 2.0, published June 2009 and/or protocols associated with RFC 3530, Network File System (NFS), version 4 Protocol, published in April 2003.

Computing device 700 may be part of a system or device that may be, for example, user equipment, a computer, a personal computer (PC), a desktop computer, a laptop computer, a notebook computer, a netbook computer, a tablet computer, a tablet, a portable gaming console, a portable media player, a smart phone, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing device 700 described herein, may be included or omitted in various embodiments of computing device 700, as suitably desired.

The components and features of computing device 700 may be implemented using any combination of discrete circuitry, application specific integrated circuits (ASICs), logic gates and/or single chip architectures. Further, the features of computing device 700 may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It should be appreciated that the exemplary computing device 700 shown in the block diagram of FIG. 7 may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in embodiments.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method comprising:
receiving, by a storage server, error data for a plurality of blocks, each of the plurality of blocks comprising a plurality of memory pages associated with a plurality of non-volatile memory cells, wherein the error data indicates which of the plurality of memory pages comprise an uncorrectable bit error that cannot be corrected by an available error correction code (ECC);
selecting, by the storage server, a block for read testing from the plurality of blocks, wherein the selection is based on selection criteria comprising the received error data;
writing, by the storage server, a predetermined pattern on each of the plurality of memory pages in the selected block before a predetermined period of time has started;
reading, by the storage server, after the predetermined period of time has expired, the predetermined pattern from each of the plurality of memory pages in the selected block;
determining, by the storage server, for each of the plurality of memory pages in the selected block, when there is a match between the predetermined pattern that was read from each of the plurality of memory pages in the selected block after the predetermined period of time has expired and the predetermined pattern that was written on each of the plurality of memory pages in the selected block before the predetermined period of time had started; and
taking, by the storage server, the block offline when a proportion of the plurality of memory pages in the selected block that comprise the predetermined pattern that do not match exceeds an error threshold proportion, wherein the proportion is based on a number of the plurality of memory pages in the selected block that do not match and a total number of the plurality of memory pages in the selected block.

2. The method of claim 1, wherein the selection criteria comprises a pre-established factor comprising a predetermined percentage of blocks to be selected from among the plurality of blocks.

3. The method of claim 1, further comprising:
determining, by the storage server, when a number the of the plurality of blocks selected for read testing exceeds a test threshold number of blocks, wherein the writing is delayed until the number of the plurality of blocks currently selected for read testing is less than the test threshold number of blocks.

4. The method of claim 1, further comprising: erasing, by the storage server, any data on the selected block before writing the predetermined pattern in each of the plurality of memory pages in the selected block.

5. The method of claim 1, comprising:
determining, by the storage server, resource usage by the storage server;
determining, by the storage server, the duration of the predetermined time period based on the determined resource usage.

6. The method of claim 1, wherein the plurality of non-volatile memory cells comprises phase change memory, flash memory, ferroelectric memory, silicon-oxide-nitride-oxide-silicon (SONOS) memory, polymer memory, nanowire, ferroelectric transistor random access memory (FeTRAM or FeRAM), or electrically erasable programmable read-only memory (EEPROM).

7. A computing device comprising:
a memory containing a machine readable medium comprising machine executable code having stored thereon instructions for performing a method of non-volatile memory assessment;
a processor coupled to the memory, the processor configured to execute machine executable code to cause the processor to:
receive error data for a plurality of blocks comprising a plurality of memory pages associated with a plurality of non-volatile memory cells, wherein the error data indicates which of the plurality of memory pages comprise a bit error that cannot be corrected by an available error correction code (ECC);
select a block for read testing from the plurality of blocks, wherein the selection is based on selection criteria comprising the received error data;

write a predetermined pattern on each of the plurality of memory pages in the selected block before a predetermined period of time has started;

read, after the predetermined period of time has expired, the predetermined pattern from each of the plurality of memory pages in the selected block;

determine, for each of the plurality of memory pages in the selected block, when there is a match between the predetermined pattern that was read from each of the plurality of memory pages in the selected block after the predetermined period of time has expired and the predetermined pattern that was written on each of the plurality of memory pages in the selected block before the predetermined period of time had started; and taking the block offline when a proportion of the plurality of memory pages in the selected block that comprise the predetermined pattern that do not match exceeds an error threshold proportion, wherein the proportion is based on a number of the plurality of memory pages in the selected block that do not match and a total number of the plurality of memory pages in the selected block.

8. The device of claim 7, wherein the selection criteria comprises pre-established factor comprising a predetermined percentage of blocks to be selected from among the plurality of blocks.

9. The device of claim 7, wherein the processor is further configured to execute machine executable code to cause the processor to:

determine when a number of the plurality of blocks selected for read testing exceeds a test threshold number of blocks, wherein the writing is delayed until the number of the plurality of blocks currently selected for read testing is less than the test threshold number of blocks.

10. The device of claim 7, wherein the processor is further configured to execute machine executable code to cause the processor to:

determine resource usage by the storage server;

determine the duration of the predetermined time period based on the determined resource usage.

11. The device of claim 7, wherein the processor is further configured to execute machine executable code to cause the processor to:

erase any data on the selected block before writing the predetermined pattern in each of the plurality of memory pages in the selected block.

12. The device of claim 7, wherein the plurality of non-volatile memory cells comprises phase change memory, flash memory, ferroelectric memory, silicon-oxide-nitride-oxide-silicon (SONOS) memory, polymer memory, nanowire, ferroelectric transistor random access memory (FeTRAM or FeRAM), or electrically erasable programmable read-only memory (EEPROM).

13. A non-transitory machine readable medium having stored thereon instructions for performing a method comprising machine executable code which when executed by at least one machine, causes the machine to:

receive error data for a plurality of blocks, each of the plurality of blocks comprising a plurality of memory pages associated with a plurality of non-volatile memory cells, the error data indicating which of the plurality of memory pages comprise a bit error that cannot be corrected by an available error correction code (ECC);

select a block for read testing from the plurality of blocks, wherein the selection is based on selection criteria comprising the received error data;

write a predetermined pattern on each of the plurality of memory pages in the selected block before a predetermined period of time has started;

read, after a predetermined period of time has elapsed, the predetermined pattern from each of the plurality of memory pages in the selected block;

determine, for each of the plurality of memory pages in the selected block, when there is a match between the predetermined pattern that was read from each of the plurality of memory pages in the selected block after the predetermined period of time has expired and the predetermined pattern that was written on each of the plurality of memory pages in the selected block before the predetermined period of time had started; and take the block offline when a proportion of the plurality of memory pages in the selected block that comprise the predetermined pattern that do not match exceeds an error threshold proportion, wherein the proportion is based on a number of the plurality of memory pages in the selected block that do not match and a total number of the plurality of memory pages in the selected block.

14. The medium of claim 13, wherein the selection criteria comprises pre-established factor comprising a predetermined percentage of blocks to be selected from the plurality of blocks.

15. The medium of claim 13, further having stored thereon instructions for performing a method comprising machine executable code which when executed by at least one machine, causes the machine to:

determine when a number of blocks selected for read testing exceeds a test threshold number of blocks, wherein the writing is delayed until the number of the plurality of blocks currently selected for read testing is less than the test threshold number of blocks.

16. The medium of claim 13, further having stored thereon instructions for performing a method comprising machine executable code which when executed by at least one machine, causes the machine to:

determine resource usage by the storage server;

determine the duration of the predetermined time period based on the determined resource usage.

17. The medium of claim 13, further having stored thereon instructions for performing a method comprising machine executable code which when executed by at least one machine, causes the machine to:

erase any data on the selected block before writing the predetermined pattern in each of the plurality of memory pages in the selected block.

18. The medium of claim 13, wherein the plurality of non-volatile memory cells comprises phase change memory, flash memory, ferroelectric memory, silicon-oxide-nitride-oxide-silicon (SONOS) memory, polymer memory, nanowire, ferroelectric transistor random access memory (FeTRAM or FeRAM), or electrically erasable programmable read-only memory (EEPROM).

* * * * *